(12) United States Patent
Lei et al.

(10) Patent No.: US 9,129,904 B2
(45) Date of Patent: *Sep. 8, 2015

(54) WAFER DICING USING PULSE TRAIN LASER WITH MULTIPLE-PULSE BURSTS AND PLASMA ETCH

(75) Inventors: Wei-Sheng Lei, San Jose, CA (US); Saravjeet Singh, Santa Clara, CA (US); Madhava Rao Yalamanchili, Morgan Hill, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 312 days.

This patent is subject to a terminal disclaimer.

(21) Appl. No.: 13/161,026

(22) Filed: Jun. 15, 2011

(65) Prior Publication Data

US 2012/0322236 A1 Dec. 20, 2012

(51) Int. Cl.
H01L 21/28 (2006.01)
H01L 21/308 (2006.01)
B23K 26/06 (2014.01)
H01L 21/67 (2006.01)
(Continued)

(52) U.S. Cl.
CPC ............ *H01L 21/3086* (2013.01); *B23K 26/06* (2013.01); *B23K 26/063* (2013.01); *B23K 26/0626* (2013.01); *B23K 26/0635* (2013.01); *B23K 26/367* (2013.01); *B23K 26/409* (2013.01); *B23K 26/4075* (2013.01); *H01L 21/67207* (2013.01); *H01L 21/78* (2013.01)

(58) Field of Classification Search
CPC ...... H01L 21/78; B23K 26/367; B23K 26/06; B23K 26/0626; B23K 26/063; B23K 26/0635
USPC .................. 438/694–696, 700–702, 460–465
See application file for complete search history.

(56) References Cited

U.S. PATENT DOCUMENTS 4,049,944 A 9/1977 Garvin et al.
4,339,528 A 7/1982 Goldman
(Continued)

FOREIGN PATENT DOCUMENTS

JP 9216085 8/1997
JP 10321908 12/1998
(Continued)

OTHER PUBLICATIONS

International Search Report and Written Opinion from PCT/US2012/040307, mailed Dec. 28, 2012, 9 pgs.
(Continued)

*Primary Examiner* — Mohammad Islam
*Assistant Examiner* — John P Dulka
(74) *Attorney, Agent, or Firm* — Blakely Sokoloff Taylor Zafman LLP

(57) ABSTRACT

Methods of dicing semiconductor wafers, each wafer having a plurality of integrated circuits, are described. A method includes forming a mask above the semiconductor wafer. The mask is composed of a layer covering and protecting the integrated circuits. The mask is patterned with a pulse train laser scribing process using multiple-pulse bursts to provide a patterned mask with gaps. The patterning exposes regions of the semiconductor wafer between the integrated circuits. The semiconductor wafer is then etched through the gaps in the patterned mask to singulate the integrated circuits.

11 Claims, 9 Drawing Sheets

(51) Int. Cl.
*B23K 26/36* (2014.01)
*B23K 26/40* (2014.01)
*H01L 21/78* (2006.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 * | 3/2011 | Arita et al. | 438/462 |
| 7,923,351 B2 | 4/2011 | Arita | |
| 7,926,410 B2 | 4/2011 | Bair | |
| 7,927,973 B2 | 4/2011 | Haji et al. | |
| 8,642,448 B2 * | 2/2014 | Lei et al. | 438/463 |
| 8,853,056 B2 * | 10/2014 | Lei et al. | 438/463 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0024924 A1 | 2/2006 | Haji et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2007/0272666 A1 | 11/2007 | O'Brien et al. | |
| 2008/0283848 A1 | 11/2008 | Yamazaki | |
| 2009/0020511 A1 * | 1/2009 | Kommera et al. | 219/121.68 |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0246611 A1 | 9/2010 | Sun | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Linder, V., et al., "Water-Soluble Sacrificial Layers for Surface Micromachining," www.small-journal.com, 2005, 1, No. 7, 7 pgs.

Singh, Saravjeet, et al., "Apparatus and Methods for Dry Etch With Edge, Side and Back Protection," U.S. Appl. No. 61/491,693, filed May 31, 2011, 24 pgs.

Non-Final Office Action from U.S. Appl. No. 13/161,006, mailed Mar. 4, 2013, 13 pgs.

International Preliminary Report on Patentability dated Dec. 17, 2013, in International Patent Application No. PCT/US2012/040307, 6 pages.

* cited by examiner

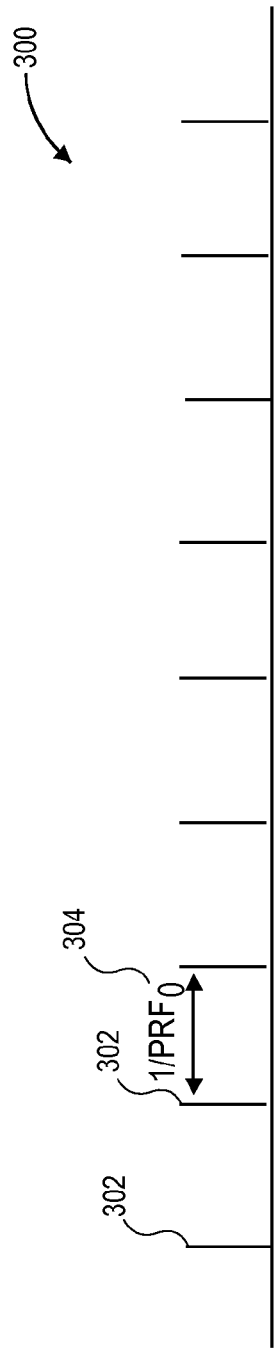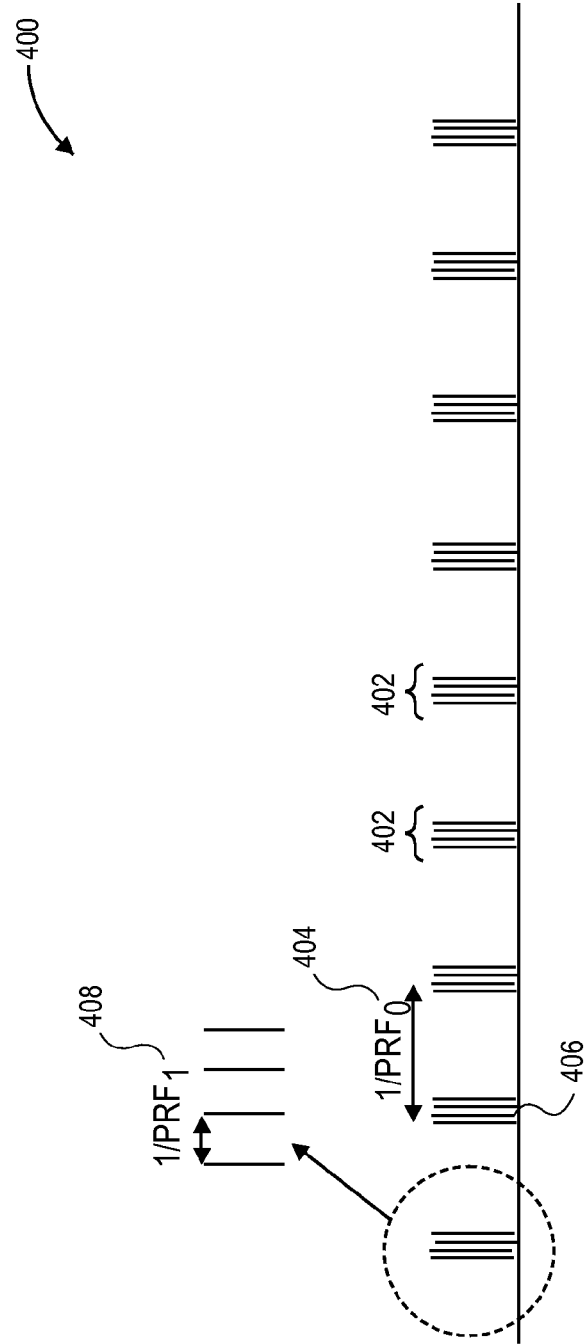

WAFER DICING USING PULSE TRAIN LASER WITH MULTIPLE-PULSE BURSTS AND PLASMA ETCH

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits includes forming a mask above the semiconductor wafer, the mask composed of a layer covering and protecting the integrated circuits. The mask is then patterned with a pulse train laser scribing process using multiple-pulse bursts to provide a patterned mask with gaps, exposing regions of the semiconductor wafer between the integrated circuits. The semiconductor wafer is then etched through the gaps in the patterned mask to singulate the integrated circuits.

In another embodiment, a system for dicing a semiconductor wafer includes a factory interface. A laser scribe apparatus is coupled with the factory interface and includes a laser configured to deliver a pulse train with multiple-pulse bursts. A plasma etch chamber is also coupled with the factory interface.

In another embodiment, a method of dicing a semiconductor wafer having a plurality of integrated circuits includes forming a polymer layer above a silicon substrate. The polymer layer covers and protects integrated circuits disposed on the silicon substrate. The integrated circuits are composed of a layer of silicon dioxide disposed above a layer of low K material and a layer of copper. The polymer layer, the layer of silicon dioxide, the layer of low K material, and the layer of copper are patterned with a pulse train laser scribing process using multiple-pulse bursts to expose regions of the silicon substrate between the integrated circuits. The silicon substrate is then etched through the gaps to singulate the integrated circuits.

BRIEF DESCRIPTION OF THE DRAWINGS

FIG. 3 illustrates a temporal plot of a train of single pulses, in accordance with an embodiment of the present invention.

FIG. 4 illustrates a temporal plot of a train of multiple-pulse bursts, in accordance with an embodiment of the present invention.

DETAILED DESCRIPTION

Figure 1:
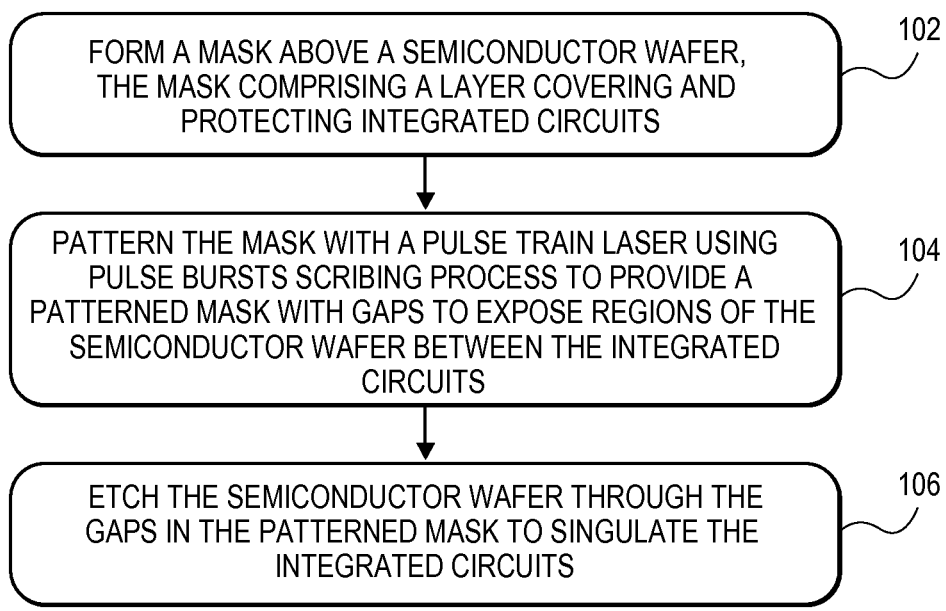
FIG. 1 is a Flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as femtosecond-based laser scribing with pulse train multiple-pulse bursts and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

During the laser scribe portion of a combination laser scribe and plasma etch singulation process, it may be desirable that a laser cleanly remove a mask layer, organic and inorganic dielectric layers, and device layers in particular orders. Then, a plasma etch process is applied through any remaining portions of an underlying silicon layer or substrate to realize chip singulation or dicing. Even in the case where a femtosecond-based laser is used in the first portion of the process, key process challenges may still exist such as, but not limited to, avoidance of micro-cracks, delamination between different layers, chipping of inorganic dielectric layers, a potential need for strict kerf width control, or a potential need for precise ablation depth control.

For laser ablation, a train of single pulses with a given pulse repetition rate may be applied to a wafer or substrate undergoing singulation. Each pulse is typically equally separated temporally (e.g., the temporal pulse to pulse separation equals to the inverse of pulse repetition frequency). In accordance with an embodiment of the present invention, a train of temporally-shaped femtosecond multiple-pulse bursts, instead of a train of single pulses, is applied for a laser scribing process. Applying a train of temporally-shaped multiple-pulse bursts may be used to better control ionization processes and yield lower ablation thresholds. In one embodiment, a train of multiple-pulse bursts is used to more precisely control ablation width (e.g., kerf width) and depth.

Figure 2A:
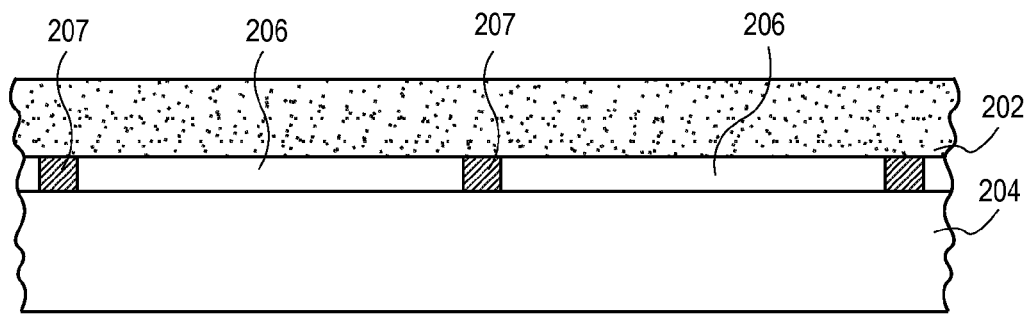
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
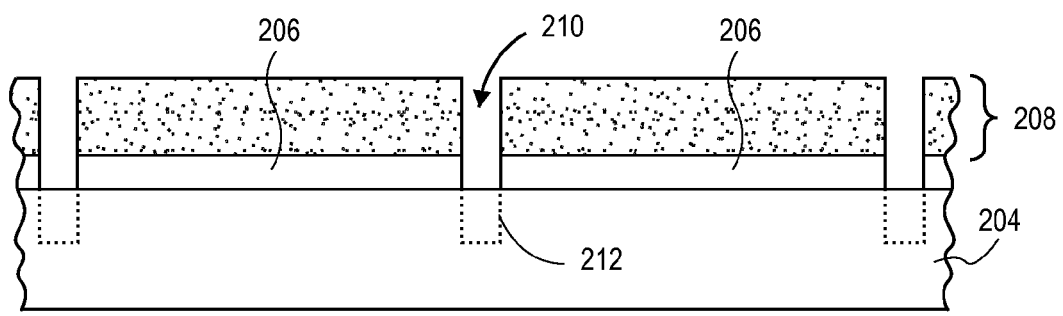
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
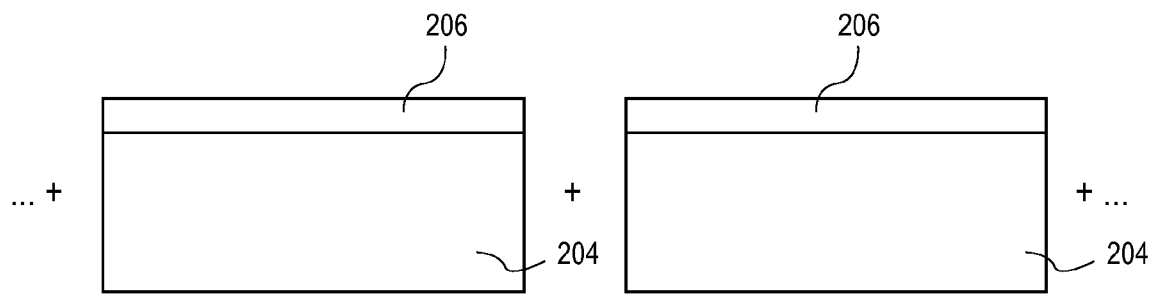
FIG. 2C illustrates a cross-sectional view of a semiconductor wafer including a plurality of integrated circuits during performing of a method of dicing the semiconductor wafer, corresponding to operation 106 of the Flowchart of FIG. 1, in accordance with an embodiment of the present invention.

Thus, in an aspect of the present invention, a combination of a pulse train laser scribing process using multiple-pulse bursts with a plasma etching process may be used to dice a semiconductor wafer into singulated integrated circuits. FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The mask 202 is composed of a layer covering and protecting integrated circuits 206 formed on the surface of semiconductor wafer 204. The mask 202 also covers intervening streets 207 formed between each of the integrated circuits 206.

In accordance with an embodiment of the present invention, forming the mask 202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a material such as, e.g., a material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring to operation 104 of Flowchart 100, and corresponding FIG. 2B, the mask 202 is patterned with a pulse train laser scribing process using multiple-pulse bursts to provide a patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the mask 202 with the pulse train laser scribing process using multiple-pulse bursts includes forming trenches 212 partially into the regions of the semiconductor wafer 204 between the integrated circuits 206, as depicted in FIG. 2B.

A train of laser pulses may be used in reference to operation 104 of Flowchart 100. For example, FIG. 3 illustrates a temporal plot 300 of a train of single pulses, in accordance with an embodiment of the present invention. Referring to FIG. 3, a train of single pulses 302 is based on a pulse repetition frequency ($PRF_0$) 304, shown temporally along the horizontal axis. The spacing between the single pulses 302 is the inverse of $PRF_0$, as depicted in FIG. 3. That is, each pulse 302 is typically equally separated temporally (e.g., the temporal pulse to pulse separation equals the inverse of the pulse repetition frequency). The train of single pulses 302 may be applied to a wafer or substrate undergoing singulation.

Depending on the complexity of layers being ablated, a train of single pulses may not provide optimal energy for ablation performance. However, delivering a greater intensity in a single pulse duration may lead to defect formation. Instead, a train of multiple-pulse bursts may be used for the ablation. For example, FIG. 4 illustrates a temporal plot 400 of a train of multiple-pulse bursts, in accordance with an embodiment of the present invention.

Referring to FIG. 4, a train of multiple-pulse bursts 402 is based on a first pulse repetition frequency ($PRF_0$) 404, shown temporally along the horizontal axis. The spacing between the multiple-pulse bursts 402 (e.g., between the centers of the groupings of single pulses 406) is the inverse of $PRF_0$, as depicted in FIG. 4. That is, each multiple-pulse burst 402 is typically equally separated temporally (e.g., the temporal multiple-pulse burst grouping to multiple-pulse burst grouping separation equals the inverse of the first pulse repetition frequency). Each of the single pulses 406 within a multiple-pulse burst 402 is based on a second pulse repetition frequency ($PRF_1$) 408, also shown temporally along the horizontal axis. The spacing between the single pulses 406 is the inverse of $PRF_1$, as depicted in FIG. 4. That is, each single pulse 406 is typically equally separated temporally. The train of multiple-pulse bursts 402 may be applied to a wafer or substrate undergoing singulation.

Any suitable number of single pulses 406 may be used in a given multiple-pulse burst 402. In an embodiment, the number of single pulses 406 used in a given multiple-pulse burst 402 is approximately in the range of 2-5. In an embodiment, first pulse repetition frequency ($PRF_0$) 404 is approximately in the range of 200 kHz to 10 MHz, although preferably approximately in the range of 500 kHz to 5 MHz. In one such embodiment, the second pulse repetition frequency ($PRF_1$) 408 is approximately 10-20 times the first pulse repetition frequency ($PRF_0$) 404 (e.g., the spacing between single pulses 406 is approximately $1/10^{th}$-$1/20^{th}$ tighter than the spacing between the centers of multiple-pulse bursts 402. In another such embodiment, the spacing between single pulses 406 in a given multiple-pulse burst 402 is based on a temporal separation approximately in the range of a few tens to a few hundreds femtoseconds, e.g., approximately in the range of 50-500 femtoseconds. In a specific embodiment, the multiple-pulse bursts 402 are run at a fixed burst repetition rate.

Referring again to FIGS. 3 and 4, the pulse train of plot 300 may be considered as a train of temporally-shaped femtosecond pulse bursts with only one pulse in each burst. By contrast, the pulse train of plot 400 is a train of temporally-shaped femtosecond multiple-pulse bursts with more than one pulse in each burst. By using such a multiple-pulse burst versus a single pulse burst, in an embodiment, less photon energy is consumed by the wafer or substrate for singulation, translating into less thermal damage. Less thermal damage may result in a minimizing of micro-cracks, delamination between different layers, or chipping of inorganic dielectric layers. In accordance with an embodiment of the present invention, a train of temporally-shaped femtosecond multiple-pulse bursts, instead of a train of single pulses, is applied for a laser scribing process. This approach may quantize laser intensity delivery to a wafer or substrate, or to films thereon, for scribing.

In an embodiment, the individual pulses 406 of the pulse bursts 402 may be delivered by using a mode-locked laser in the form of a pulse train with first and second pulse repetition rates. Certain pulses may be selected for delivery from such a pulse train, e.g., to transmit only certain pulses and block all the others. The selected delivery may be performed with a pulse picker, which is essentially an electrically controlled optical switch. In an embodiment, a pulse picker is based on an electro-optic modulator or an acousto-optic modulator, combined with a suitable electronic driver.

In the case of an electro-optic device, a pulse picker may consist of a Pockels cell along with polarizing optics, e.g. a thin-film polarizer. The Pockels cell may be used to manipulate the polarization state, and the polarizer may then transmit or block the pulse depending on its polarization. In the case of an acousto-optic pulse picker, a short RF pulse may be applied to the acousto-optic modulator so as to deflect the wanted pulse into a slightly modified direction. The deflected pulses may then pass an aperture, whereas the others are blocked. In either case, the required speed of the modulator may be determined by the temporal distance of pulses in the pulse train (e.g., by the pulse repetition rate of the pulse source), rather than by the pulse duration.

The electronic driver of a pulse picker may fulfill additional functions. For example, in one embodiment, an electronic driver uses the signal from a fast photodiode, sensing the original pulse train, in order to synchronize the switching with the input pulses. A trigger signal may then come at any time, and the electronics will act on the switch at the proper time to transmit the next arriving input pulse. For obtaining high pulse energies in ultrashort pulses, the pulse repetition rate may be reduced. Reduction of the rate may be performed by placing a pulse picker between a seed laser and an amplifier. The amplifier is configured to act only on the wanted pulses. The blocked pulses do not necessarily constitute a strong energy loss since the average power of the seed laser may be small compared with the average output power of the amplifier, and the remaining average power can be sufficient for saturating the amplifier.

Even with the use of multiple-pulse bursts in a pulse train, the use of a femtosecond-based laser (versus, e.g., a picoseconds-based laser or a nanosecond-based laser) may be used to further optimize ablation performance of a complex stack of layers undergoing a singulation process. Thus, in an embodiment, patterning the mask 206 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Figure 5:
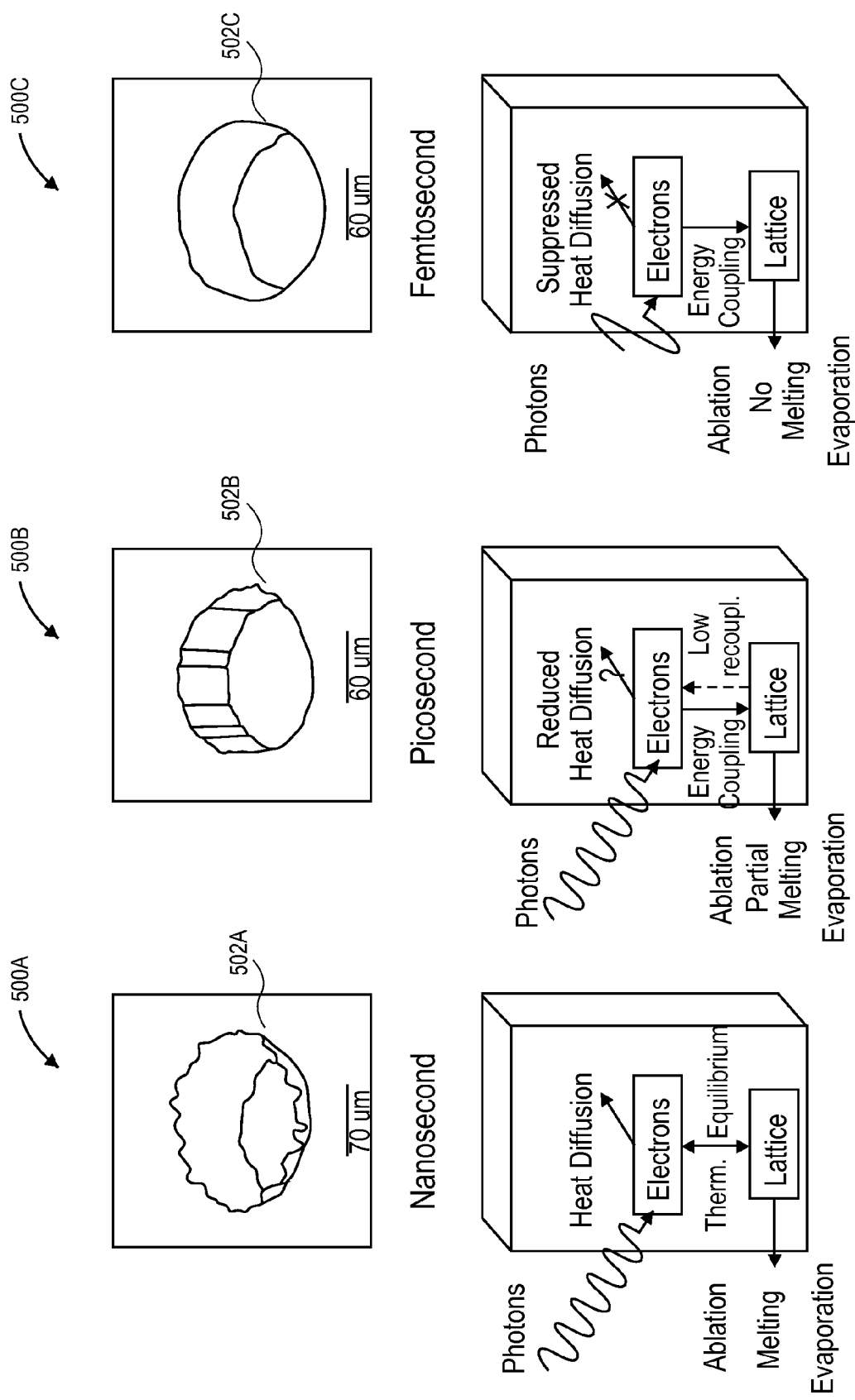
FIG. 5 illustrates the effects of using a laser pulse in the femtosecond range versus longer pulse times, in accordance with an embodiment of the present invention.

FIG. 5 illustrates the effects of using a laser pulse in the femtosecond range versus longer pulse widths, in accordance with an embodiment of the present invention. Referring to FIG. 5, by using a laser pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
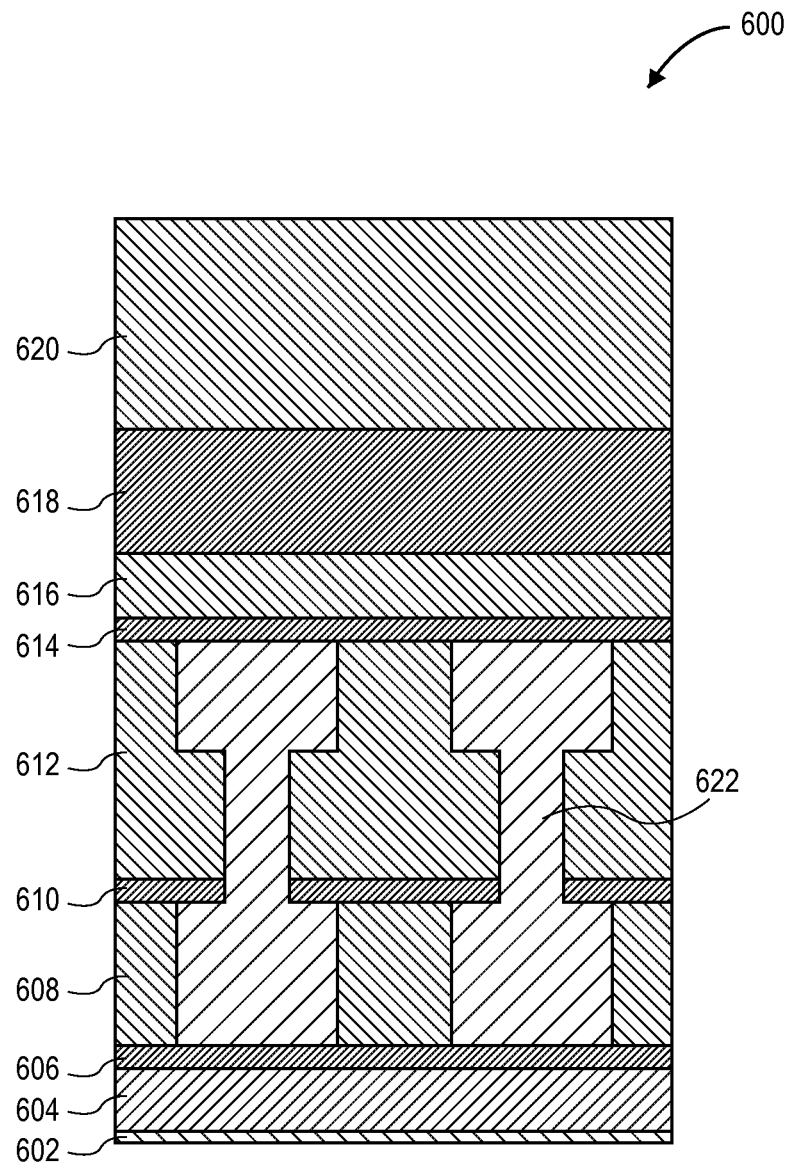
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photo-resist 620, with relative thicknesses depicted. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, a laser train of multiple-pulse bursts is used to pattern a layer of silicon dioxide, a layer of low K material, and a layer of copper with a femtosecond-based laser scribing process by ablating the layer of silicon dioxide prior to ablating the layer of low K material and the layer of copper.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 300 mm/sec to 5 m/sec, although preferably approximately in the range of 500 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes.

However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 106 of Flowchart 100, and corresponding FIG. 2C, the semiconductor wafer 204 is etched through the gaps 210 in the patterned mask 208 to singulate the integrated circuits 206. In accordance with an embodiment of the present invention, etching the semiconductor wafer 204 includes ultimately etching entirely through semiconductor wafer 204, as depicted in FIG. 2C, by etching the trenches 212 initially formed with the laser scribing process using the pulse train with multiple-pulse bursts.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate. In an embodiment, the mask layer 208 is removed after the singulation process, as depicted in FIG. 2C.

Accordingly, referring again to Flowchart 100 and FIGS. 2A-2C, wafer dicing may be preformed by initial ablation using a pulse train laser scribing process with multiple-pulse bursts to ablate through a mask layer, through wafer streets (including metallization), and partially into a silicon substrate. Die singulation may then be completed by subsequent through-silicon deep plasma etching. A specific example of a materials stack for dicing is described below in association with FIGS. 7A-7D, in accordance with an embodiment of the present invention.

Figure 7A:
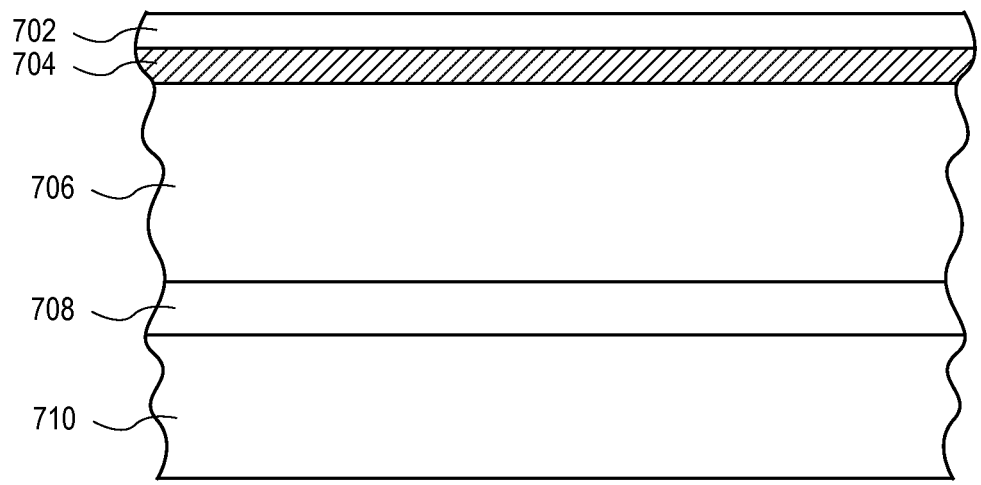
FIGS. 7A-7D illustrate cross-sectional views of various operations in a method of dicing a semiconductor wafer, in accordance with an embodiment of the present invention.

Referring to FIG. 7A, a materials stack for hybrid laser ablation and plasma etch dicing includes a mask layer 702, a device layer 704, and a substrate 706. The mask layer, device layer, and substrate are disposed above a die attach film 708 which is affixed to a backing tape 710. In an embodiment, the mask layer 702 is a photo-resist layer such as the photo-resist layers described above in association with mask 202. The device layer 704 includes an inorganic dielectric layer (such as silicon dioxide) disposed above one or more metal layers (such as copper layers) and one or more low K dielectric layers (such as carbon-doped oxide layers). The device layer 704 also includes streets arranged between integrated circuits, the streets including the same or similar layers to the integrated circuits. The substrate 706 is a bulk single-crystalline silicon substrate.

In an embodiment, the bulk single-crystalline silicon substrate 706 is thinned from the backside prior to being affixed to the die attach film 708. The thinning may be performed by a backside grind process. In one embodiment, the bulk single-crystalline silicon substrate 706 is thinned to a thickness approximately in the range of 50-100 microns. It is important to note that, in an embodiment, the thinning is performed prior to a laser ablation and plasma etch dicing process. In an embodiment, the photo-resist layer 702 has a thickness of approximately 5 microns and the device layer 704 has a thickness approximately in the range of 2-3 microns. In an embodiment, the die attach film 708 (or any suitable substitute capable of bonding a thinned or thin wafer or substrate to the backing tape 710) has a thickness of approximately 20 microns.

Figure 7B:
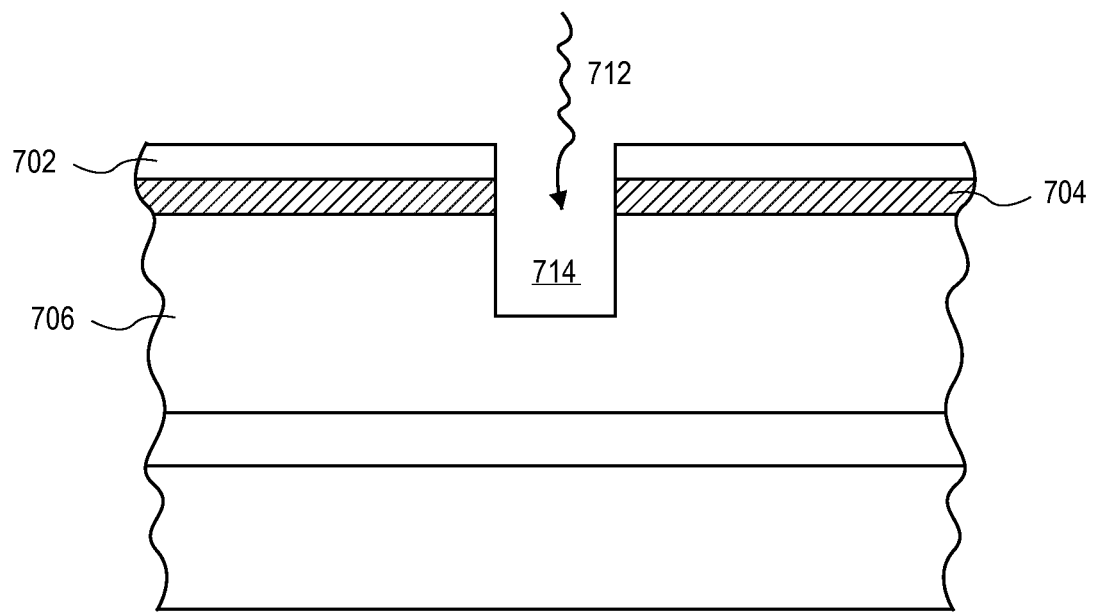
Figure 7C:
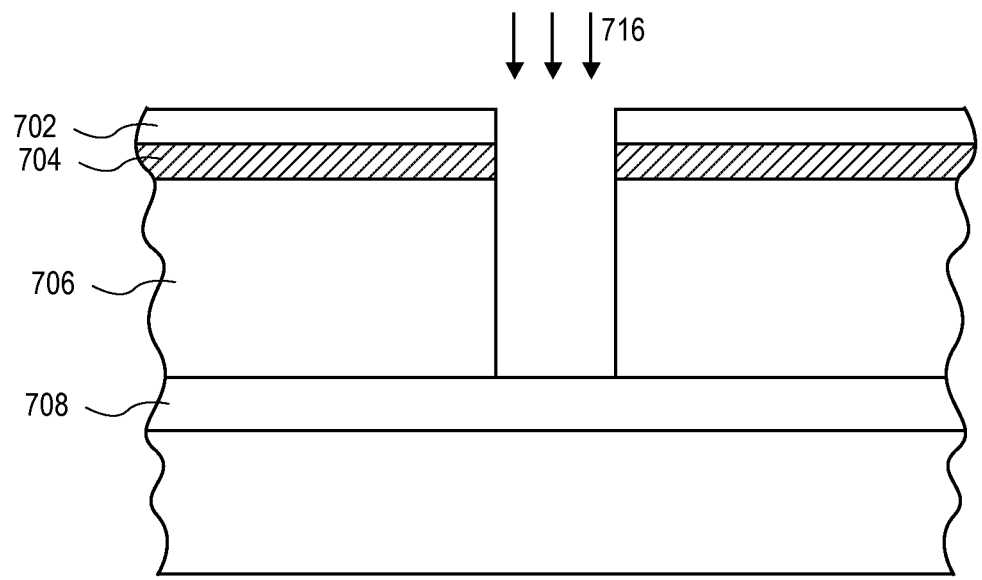

Referring to FIG. 7B, the mask 702, the device layer 704 and a portion of the substrate 706 are patterned with a pulse train laser scribing process using multiple-pulse bursts 712 to form trenches 714 in the substrate 706. Referring to FIG. 7C, a through-silicon deep plasma etch process 716 is used to extend the trench 714 down to the die attach film 708, exposing the top portion of the die attach film 708 and singulating the silicon substrate 706. The device layer 704 is protected by the photo-resist layer 702 during the through-silicon deep plasma etch process 716.

Figure 7D:
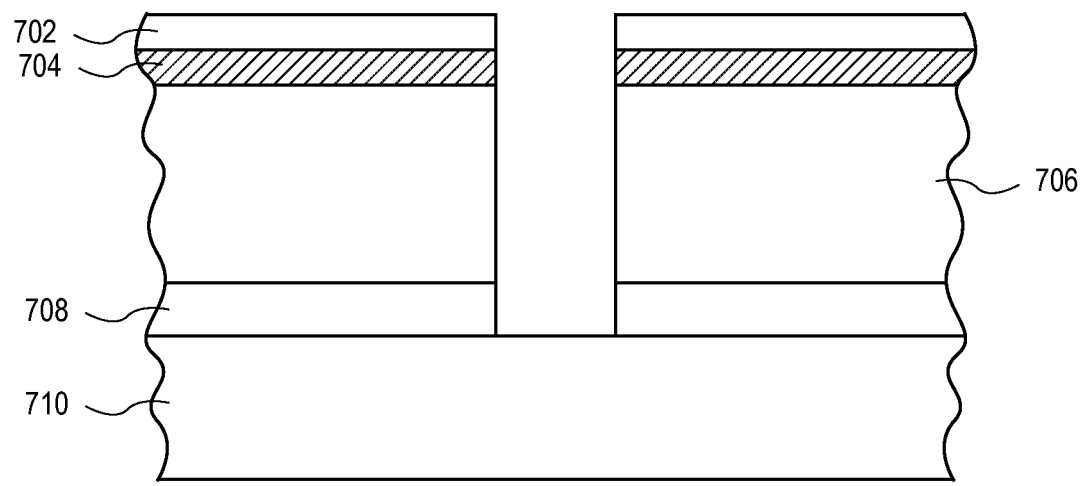

Referring to FIG. 7D, the singulation process may further include patterning the die attach film 708, exposing the top portion of the backing tape 710 and singulating the die attach film 708. In an embodiment, the die attach film is singulated by a laser process or by an etch process. Further embodiments may include subsequently removing the singulated portions of substrate 706 (e.g., as individual integrated circuits) from the backing tape 710. In one embodiment, the singulated die attach film 708 is retained on the back sides of the singulated portions of substrate 706. Other embodiments may include removing the masking photo-resist layer 702 from the device layer 704. In an alternative embodiment, in the case that substrate 706 is thinner than approximately 50 microns, the laser ablation process 712 is used to completely singulate substrate 706 without the use of an additional plasma process.

Subsequent to singulating the die attach film 708, in an embodiment, the masking photo-resist layer 702 is removed from the device layer 704. In an embodiment, the singulated integrated circuits are removed from the backing tape 710 for packaging. In one such embodiment, the patterned die attach film 708 is retained on the backside of each integrated circuit and included in the final packaging. However, in another embodiment, the patterned die attach film 708 is removed during or subsequent to the singulation process.

A single process tool may be configured to perform many or all of the operations in a hybrid laser train with multiple-pulse bursts ablation and plasma etch singulation process. For example, FIG. 8 illustrates a block diagram of a tool layout for laser and plasma dicing of wafers or substrates, in accordance with an embodiment of the present invention.

Figure 8:
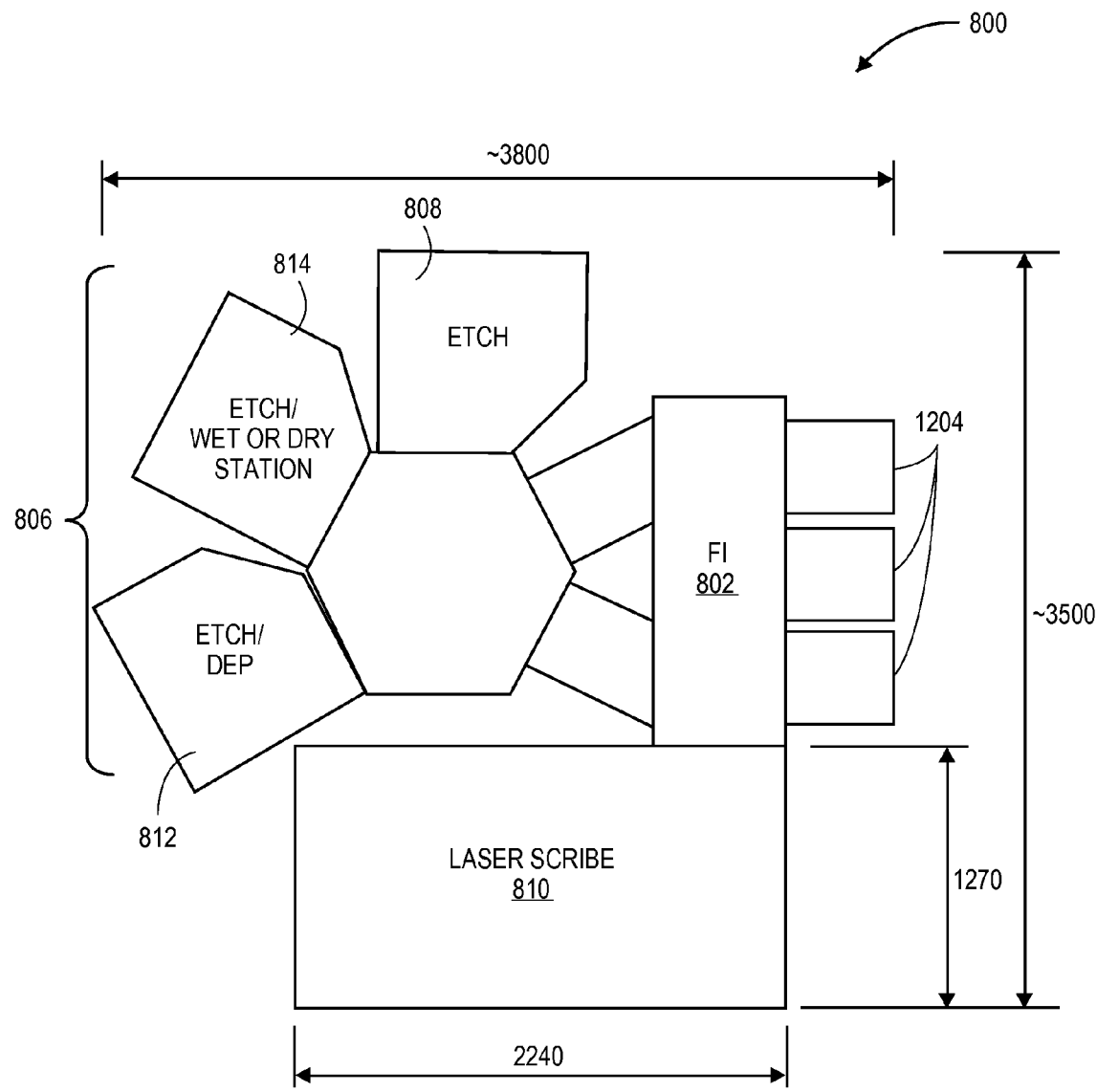
FIG. 8 illustrates a block diagram of a tool layout for laser and plasma dicing of wafers or substrates, in accordance with an embodiment of the present invention.

Referring to FIG. 8, a process tool 800 includes a factory interface 802 (FI) having a plurality of load locks 804 coupled therewith. A cluster tool 806 is coupled with the factory interface 802. The cluster tool 806 includes one or more plasma etch chambers, such as plasma etch chamber 808. A laser scribe apparatus 810 is also coupled to the factory interface 802. The overall footprint of the process tool 800 may be, in one embodiment, approximately 3500 millimeters (3.5 meters) by approximately 3800 millimeters (3.8 meters), as depicted in FIG. 8.

In an embodiment, the laser scribe apparatus 810 houses a laser configured to deliver a pulse train with multiple-pulse bursts. The laser is suitable for performing a laser ablation portion of a hybrid laser and etch singulation process, such as the laser ablation processes described above. In one embodiment, a moveable stage is also included in laser scribe apparatus 810, the moveable stage configured for moving a wafer or substrate (or a carrier thereof) relative to the laser. In a specific embodiment, the laser is also moveable. The overall footprint of the laser scribe apparatus 810 may be, in one embodiment, approximately 2240 millimeters by approximately 1270 millimeters, as depicted in FIG. 8.

In an embodiment, the one or more plasma etch chambers 808 is configured for etching a wafer or substrate through the gaps in a patterned mask to singulate a plurality of integrated circuits. In one such embodiment, the one or more plasma etch chambers 808 is configured to perform a deep silicon etch process. In a specific embodiment, the one or more plasma etch chambers 808 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 808 to facilitate high silicon etch rates. In an embodiment, more than one etch chamber is included in the cluster tool 806 portion of process tool 800 to enable high manufacturing throughput of the singulation or dicing process.

The factory interface 802 may be a suitable atmospheric port to interface between an outside manufacturing facility with laser scribe apparatus 810 and cluster tool 806. The factory interface 802 may include robots with arms or blades for transferring wafers (or carriers thereof) from storage units (such as front opening unified pods) into either cluster tool 806 or laser scribe apparatus 810, or both.

Cluster tool 806 may include other chambers suitable for performing functions in a method of singulation. For example, in one embodiment, in place of an additional etch chamber, a deposition chamber 812 is included. The deposition chamber 812 may be configured for mask deposition on or above a device layer of a wafer or substrate prior to laser scribing of the wafer or substrate. In one such embodiment, the deposition chamber 812 is suitable for depositing a photoresist layer. In another embodiment, in place of an additional etch chamber, a wet/dry station 814 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 800.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 800 described in association with FIG. 8. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
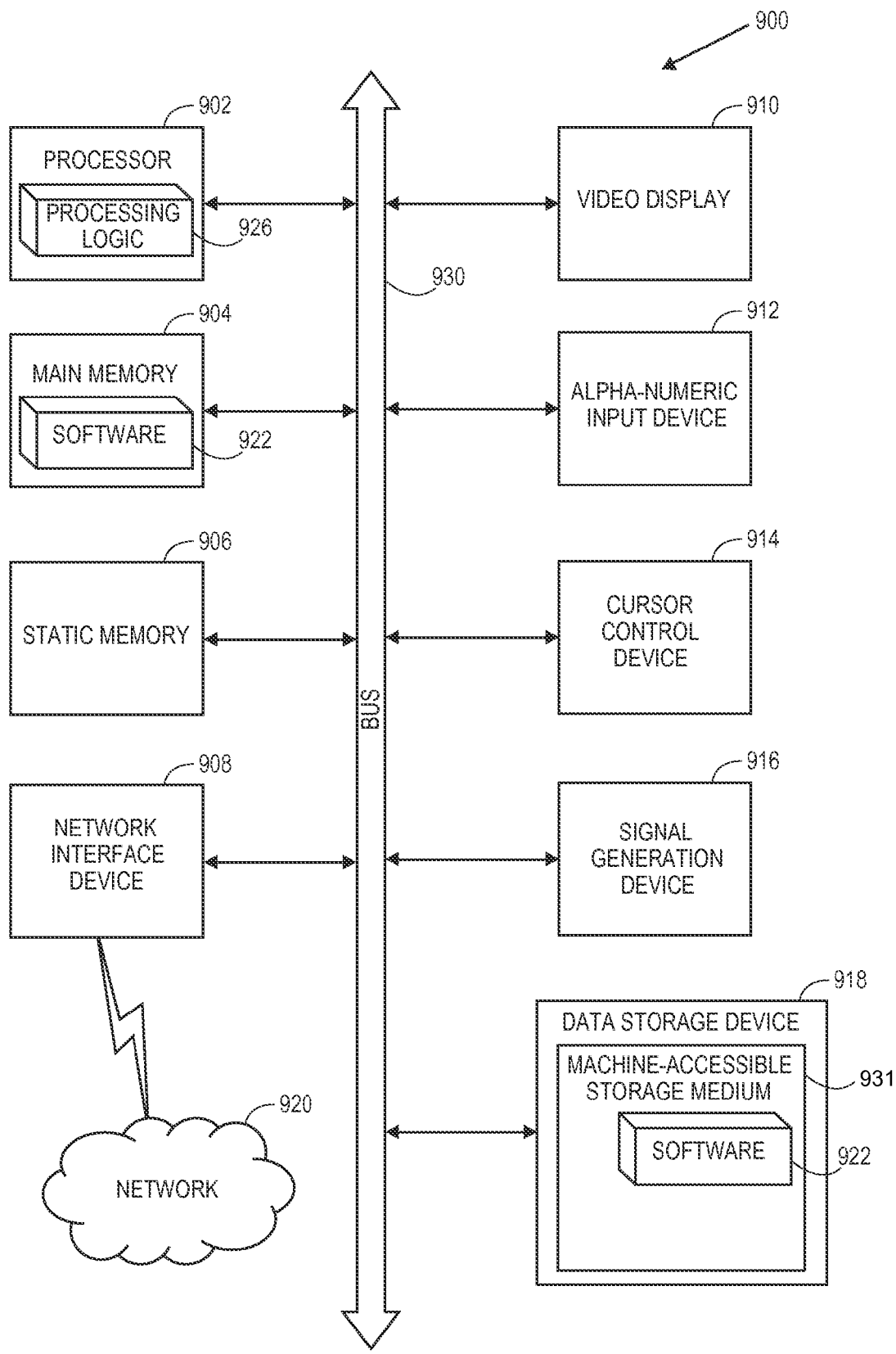
FIG. 9 illustrates a block diagram of an exemplary computer system, in accordance with an embodiment of the present invention.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a pulse train laser scribing process using multiple-pulse bursts to provide a patterned mask with gaps. Regions of the semiconductor wafer are exposed between the integrated circuits. The semiconductor wafer is then etched through the gaps in the patterned mask to singulate the integrated circuits.

Thus, methods of dicing semiconductor wafers, each wafer having a plurality of integrated circuits, have been disclosed. In accordance with an embodiment of the present invention, a method includes dicing a semiconductor wafer having a plurality of integrated circuits includes forming a mask above the semiconductor wafer, the mask composed of a layer covering and protecting the integrated circuits. The method also includes patterning the mask with a pulse train laser scribing process using multiple-pulse bursts to provide a patterned mask with gaps, exposing regions of the semiconductor wafer between the integrated circuits. The method also includes etching the semiconductor wafer through the gaps in the patterned mask to singulate the integrated circuits. In one embodiment, patterning the mask with the pulse train laser scribing process using multiple-pulse bursts includes using bursts having 2-5 pulses per burst. In one embodiment, patterning the mask with the pulse train laser scribing process using multiple-pulse bursts includes using a femtosecond-based laser.

What is claimed is:

1. A method of dicing a semiconductor wafer comprising a front surface having a plurality of integrated circuits thereon and having a back surface opposite the front surface, the method comprising:
    forming an outermost mask on the front surface of the semiconductor wafer, the outermost mask comprising a layer covering and protecting the integrated circuits;
    patterning the outermost mask and a portion of the semiconductor wafer with a pulse train laser scribing process using multiple-pulse bursts to provide a patterned outermost mask and to form trenches partially into but not through the semiconductor wafer between the integrated circuits, each of the trenches having a width; and
    plasma etching, with the patterned outermost mask exposed, the semiconductor wafer through the trenches to form corresponding trench extensions and to singulate the integrated circuits, each of the corresponding trench extensions having the width.

2. The method of claim 1, wherein patterning the outermost mask and the portion of the semiconductor wafer with the pulse train laser scribing process using multiple-pulse bursts comprises using bursts having 2-5 pulses per burst.

3. The method of claim 1, wherein patterning the outermost mask and the portion of the semiconductor wafer with the pulse train laser scribing process using multiple-pulse bursts comprises using a burst frequency approximately in the range of 300 kHz to 10 MHz, and a pulse frequency approximately 10-20 times the burst frequency.

4. The method of claim 3, wherein the pulse frequency provides a pulse temporal spacing approximately in the range of 50-500 femtoseconds.

5. The method of claim 1, wherein patterning the outermost mask and the portion of the semiconductor wafer with the pulse train laser scribing process using multiple-pulse bursts comprises using a femtosecond-based laser.

6. The method of claim 5, wherein using the femtosecond-based laser comprises using a laser having a wavelength of approximately less than or equal to 540 nanometers.

7. A method of dicing a silicon substrate comprising a front surface having a plurality of integrated circuits thereon and having a back surface opposite the front surface, the method comprising:
    forming an outermost polymer layer on the front surface of the silicon substrate, the outermost polymer layer covering and protecting the integrated circuits, the integrated circuits comprising a layer of silicon dioxide disposed above a layer of low K material and a layer of copper;
    patterning the outermost polymer layer, the layer of silicon dioxide, the layer of low K material, the layer of copper, and a portion of the silicon substrate with a pulse train laser scribing process using multiple-pulse bursts to form trenches partially into but not through regions of the silicon substrate between the integrated circuits, each of the trenches having a width; and
    plasma etching, from the front surface of the silicon substrate, the silicon substrate through the trenches to form corresponding trench extensions and to singulate the integrated circuits, each of the corresponding trench extensions having the width.

8. The method of claim 7, wherein patterning the outermost polymer layer, the layer of silicon dioxide, the layer of low K material, the layer of copper, and the portion of the silicon substrate with the pulse train laser scribing process using multiple-pulse bursts comprises ablating the layer of silicon dioxide prior to ablating the layer of low K material and the layer of copper.

9. The method of claim 7, wherein patterning with the pulse train laser scribing process using multiple-pulse bursts comprises using bursts having 2-5 pulses per burst.

10. The method of claim 7, wherein patterning with the pulse train laser scribing process using multiple-pulse bursts comprises using a burst frequency approximately in the range of 300 kHz to 10 MHz, and a pulse frequency approximately 10-20 times the burst frequency.

11. The method of claim 10, wherein the pulse frequency provides a pulse temporal spacing approximately in the range of 50-500 femtoseconds.

* * * * *